Sept. 6, 1966

G. E. MOORE 3,271,640

SEMICONDUCTOR TETRODE

Filed Oct. 11, 1962

2 Sheets-Sheet 1

GORDON E. MOORE
INVENTOR.

BY

Lippincott, Ralls & Hendricson
ATTORNEYS

GORDON E. MOORE
INVENTOR.

BY

Lippincott, Ralls & Hendricson
ATTORNEYS

United States Patent Office 3,271,640
Patented Sept. 6, 1966

3,271,640
SEMICONDUCTOR TETRODE
Gordon E. Moore, Los Altos Hills, Calif., assignor to Fairchild Camera and Instrument Corporation, Syosset, N.Y., a corporation of Delaware
Filed Oct. 11, 1962, Ser. No. 229,839
11 Claims. (Cl. 317—235)

This invention relates to an improved semiconductor tetrode useful for electronic switches, A.-C. and D.-C. amplifiers, oscillators, mixers, etc. The new devices provided by the invention are capable of virtually complete cut-off of collector current in one mode of operation, while presenting a relatively low base spreading resistance in another mode of operation. These features make the devices particularly useful in high frequency devices, such as are used in computers and automatic gain control circuits.

Surface-potential controlled semiconductor devices differ from usual semiconductor devices in that they have a control electrode capacitatively coupled to the semiconductor in the vicinity of the emitter-base junction. The voltage applied to this control electrode influences currents flowing between other electrodes of the device, particularly the collector current. This is accomplished by an effect on the recombination of holes and electrons at the surface of the semiconductor resulting from the electric potential or charge induced at the surface of the semiconductor by the application of an electric potential at the control electrode. Because this control electrode is insulated from the semiconductor body and capacitatively coupled to it, the input impedance to the control electrode is generally very high. This electrode is therefore similar to the grid of a vacuum tube. A further explanation of devices of this type may be found in copending application Serial No. 102,515, now Patent No. 3,204,160, assigned to the same assignee as this invention.

A surface-potential controlled semiconductor device makes possible a substantial decrease in the ratio of collector current to base current by adjusting the voltage at the control electrode. With improved devices of copending application Serial No. 201,456, now Patent No. 3,243,-669, assigned to the same assignee as this invention, virtually complete cut-off of collector current was achieved by using an extra region (called the shorting region). This region was disposed within the base region extending inwardly from its surface. This shorting region was sometimes ohmically connected to the base region, providing an effective short directly from emitter to base with proper voltage at the control electrode. Collector current was thus virtually eliminated in one mode of operation, so that $I_{cco}=I_{co}$ (usually less than $1\times10^{-9}$ ampere for planar devices).

However, when these devices were used in the mode of operation where both base and collector current flowed, the necessary arrangement of the regions of the device created a relatively high and undesirable base spreading resistance. Briefly, this resistance in the base was a result of the shorting regions themselves. They lay in the direct path of current flow from emitter to base. However, they were of the opposite conductivity type from the base. Therefore, they had very few of the type of impurities which are majority current carriers in the base region. Majority current through the base had to take the tortuous path around the shorting regions, thereby creating a high base-spreading resistance. This resistance dissipated the signal and reduced the upper limit of frequency at which the device is operative in all modes, curtailing its usefulness.

The new semiconductor tetrodes of this invention are designed not only to provide virtually complete cutoff of collector current by proper adjustment of the control electrode voltage, but also to provide a relatively low base spreading resistance. This dual purpose is accomplished by an improved novel design wherein the shorting region is not a solid strip or ring of semiconductor material of one conductivity type, but rather an alignment of spaced-apart regions separated by material of the opposite conductivity type. This alignment may be linear, circular, or other desired geometry. The spaces within the shorting region provide a direct path through the shorting region for majority current carriers in the base. The invention provides, therefore, devices with improved switching characteristics for relays and the like where complete cut-off of collector current is essential in one mode of operation and low base spreading resistance is a requisite in the other mode. This reduction in spreading resistance provides a substantial increase in the maximum operating frequency of the device, i.e., the maximum frequency at which switching is possible. Many applications of these devices will be obvious to one skilled in the use of semiconductor devices.

Briefly, the semiconductor tetrodes of this invention comprise a body of monocrystalline semiconductor with adjacent regions of different conductivity types. There is a first region of one conductivity type which may be either P- or N-type; the conductivity types of the remaining regions of the device are chosen according to the type used for this first region. A second region of the opposite conductivity type from the first region is disposed within the first region and extends inwardly from its surface. This second region forms a PN junction with the first region which has an edge at the surface of the body of semiconductor. Additionally, there is an alignment of spaced-apart regions of the opposite conductivity type for the first region disposed within the first region and extending inwardly from its surface. This row of spaced-apart regions forms an alignment of spaced-apart PN junctions having an alignment of edges at the surface of the body of semiconductor. Between the first PN junction and the alignment of PN junctions is a surface channel region which lies adjacent to the first region. This surface channel is generally thin, and may be fabricated of either conductivity type. A control electrode is capacitatively coupled to the semiconductor in spaced relationship to the surface channel region and to the edge of the first PN junction and the alignment of edges. There is generally an insulating layer in the space between the control electrode and the surface channel region. Where the semiconductor material is silicon, this layer is preferably silicon dioxide. The control electrode is adapted to change the conductivity type of the surface channel region in response to a change in its potential. Finally, there are means, usually electrodes, for passing current across the PN junction between the first and second regions. In a preferred embodiment of the invention, where virtually complete elimination of $I_{cco}$ is desired, there are ohmic connections between the first region and each of the alignment of spaced-apart regions of the device. This ohmic connection may, if desired, be an electrode.

The invention may be better understood from the following illustrative description and the accompanying drawings, wherein:

FIG. 1 of the drawings is a somewhat schematic, greatly enlarged plan view of a semiconductor tetrode of the invention;

Figure 1:
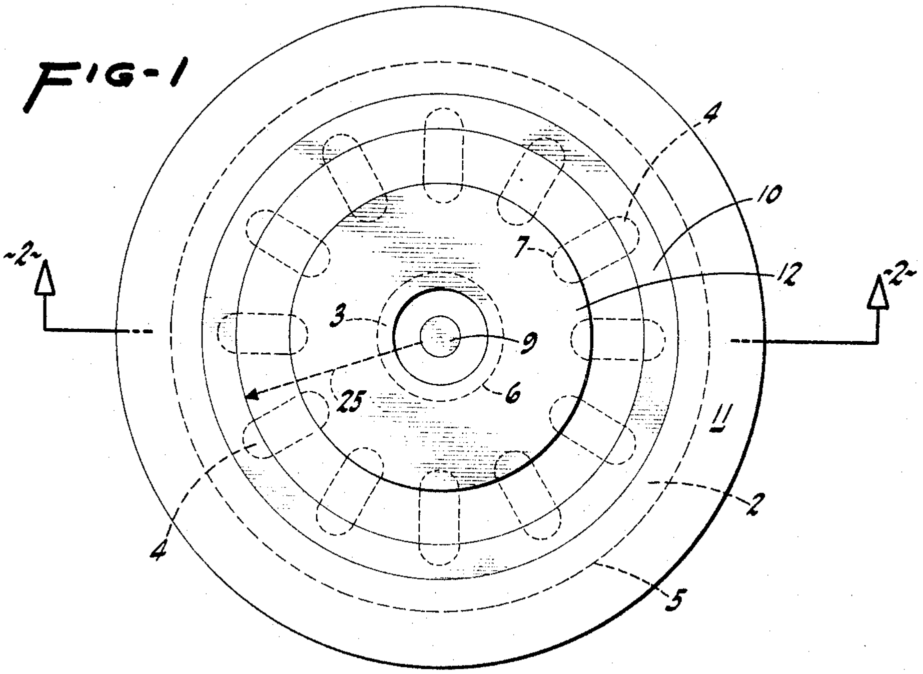
Figure 2:
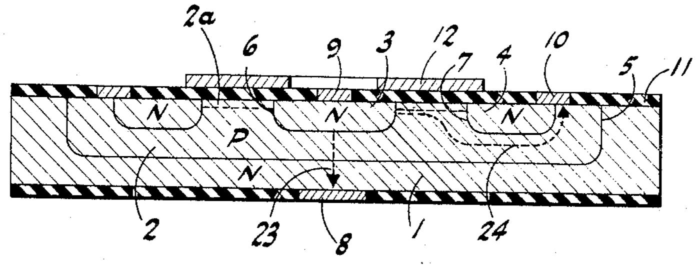
FIG. 2 is a somewhat schematic transverse section taken along the line 2—2 of FIG. 1.

FIGS. 1 and 2 illustrate an NPN semiconductor tetrode of the invention having an emitter, a base, a collector, and a circular alignment of spaced-apart shorting regions. A PNP semiconductor tetrode would be the same, but with the conductivity type of each region (except possibly the channel region, as explained later) reversed. As illustrated, a monocrystalline body of semiconductor, e.g., silicon or any other semiconductor useful in the fabrication of semiconductor devices, has a collector region 1 of N conductivity type, a base region 2 of P conductivity type, a channel region 2*a* of either conductivity type (P-type in the illustration), an emitter region 3 of N conductivity type, and a circular alignment of spaced-apart regions 4, also of N conductivity type. In the planar configuration illustrated, the base-collector junction 5 between regions 1 and 2 extends to the top surface of the body of semiconductor and is bounded there by a circular edge extending completely around the periphery of base region 2. The emitter-base junction 6 between regions 2 and 3 also extends to the top surface of the body of semiconductor and is bounded there by a circular edge extending completely around the periphery of the emitter region 3. The alignment of spaced-apart shorting regions 4 are disposed within the base region 2 extending inwardly from its surface. The alignment of junctions 7 between the shorting regions 4 and the base region 2 also extend to the surface of the body of semiconductor and form a plurality of edges there. Electrodes 8 and 9 are in ohmic contact with the collector and emitter regions, respectively. In the preferred embodiment shown in FIGS. 1 and 2, electrode 10 is ohmically connected both to the base region 2 and the shorting regions 4. If desired, there may be more than one such electrode, each in contact with the base region 2 and some of shorting regions 4. Conveniently, electrode 8 may be a metal layer deposited on the back or underside of the semiconductor; electrodes 9 and 10 may be metal-film dots or rings, respectively, deposited on the top surface of the body of semiconductor over and in contact with the emitter region, and portions of the base and shorting regions respectively, as shown.

In this embodiment, the whole top surface of the body of semiconductor, except the portions covered by contacts 9 and 10, is covered and protected by insulating layer 11, perferably silicon dioxide, in the case of silicon. This layer may be formed by oxidizing the surface of the body of semiconductor at an early stage of fabrication, thereby firmly attaching it to the surface. Insulating layer 11 protects the junctions during and after manufacture, resulting in improved quality and reliability of the tetrode. Region 1 may have the conductivity of the original crystal from which the device is fabricated, and regions 2, 3, and 4 may be formed by diffusing impurities through holes etched or engraved in the oxide layer 11 by processes already known in the art.

Insofar as the essential principles of the present invention are concerned, however, regions 1, 2, 3, and 4 may be formed in any desired manner, and insulating layer 11 may be of ay suitable insulating material. The essential requirement for layer 11 is that it cover the channel region 2*a*. This layer separates and insulates the control electrode 12 from channel region 2*a*. If desired, channel region 2*a* may be fabricated of the opposite conductivity type from the base. Its conductivity type may be changed during operation of the device by adjusting the potential on the control electrode. This process will be explained in detail later. The spatial arrangement of control electrode 12 and base electrode 10 can take on many variations. The essential requirement is that they do not touch. In the embodiment illustrated in FIGS. 1 and 2, control electrode 12 is an annular film of metal coated onto the insulating layer 11 immediately over the channel region 2*a* between junctions 6 and 7, as shown. Electrode 12 is therefore in capacitatively coupled relation to the semiconductor in the immediate vicinity of channel region 2*a*. A metal film electrode adheres firmly to the insulating oxide layer 11, forming a durable structure. A voltage applied to this electrode 12 affects the surface potential in the channel region 2*a* beneath them. This channel can, by proper voltage, be effectively changed from one conductivity type to the other, as explained below. The voltage applied to the control electrode has a significant effect upon current flowing between other electrodes of the transistor.

It will now be helpful to understand in detail how the improvement provided by this invention in semiconductor devices gives them their improved operation. The principal applications of surface-potential controlled semiconductor devices utilize their ability to control currents flowing between electrodes of the device by regulating the potential at the control electrode. By including the shorting region in the semiconductor device, it has been found possible, by proper application of a voltage to the control electrode, to cut off collector current almost completely—forming an effective short between emitter and base.

Referring again to FIGS. 1 and 2, the base current $I_b$ flows from the emitter contact 9 through the N-type material of the emitter 3 through the P-type material of the base 2 to the base electrode 10. Current $I_c$ also flows from the emitter contact 9 through the emitter 3, through the base 2, through the collector 1, to the collector contact 8. In the NPN semiconductor tetrode illustrated, the control electrode voltage is generally made positive wherein $I_c$ is to be reduced or eliminated. Control electrode 12 is capacitatively coupled to the surface channel region 2*a* extending between junctions 6 and 7, as shown. A positive voltage at the control electrode 12 creates a positive charge on the electrode. The surface channel region 2*a*, which is capacitatively coupled to the control electrode, then becomes negatively charged. Although the surface channel is fabricated of P-type material, i.e., electron-deficient or hole-containing, the negative charge at its surface not only fills the deficiency but also creates an excess of electrons, and thus effectively changes the conductivity type of the surface channel to N-type. The surface channel is, in effect, a resistance connected across the emitter and base electrodes. It is possible, therefore, in the illustrated device having an ohmic connection between each of the alignments of shorting regions and the base, to adjust the control voltage to a sufficient positive value to create a large enough low-resistance surface channel to be essentially a short circuit between the emitter electrode 9 and the base electrode 10. For a very large channel, essentially all the current flows from the emitter electrode 9 through the short circuit to the base electrode 10, completely cutting off any current $I_c$ which would otherwise flow to the collector electrode.

Where the surface channel region 2*a* is fabricated of the opposite conductivity type from the base region 2 (N-type in FIGS. 1 and 2), this channel region is in parallel with the emitter-base junction when there is no control electrode voltage. With this construction, whenever there is no voltage or a positive voltage at the control electrode, the surface channel remains N-type, creating an effective short circuit between the emitter and shorting regions. If the shorting regions are ohmically connected to the base, then the emitter and base are effectively shorted. However, a negative voltage at the control electrode effectively makes the surface channel region 2*a* P-type, thus eliminating the shorting effect of the previously N-type surface channel. Whether the surface channel is initially the same conductivity type as the base, or the opposite conductivity type, its effect is the same. Only the magnitude and polarity of the control electrode voltage required to create a short circuit between the emitter and base regions through the surface channel is changed.

It was found, however, that these shorting regions, in prior devices having a solid shorting region, interfered with the passage of current between emitter and base during non-cutoff operation. Still referring to FIGS. 1 and 2, during non-cutoff operation, current flows from emitter contact 9 in two ways. First, a collector current flows along path 23 from emitter region 3 through base region 2 to collector region 1. Thus, the collector current path is across the emitter-base and base-collector junction. In addition, base current flows in a second current path from emitter 3 across a portion of the base region 2 into base contact 10. In the prior surface-potential controlled semiconductor device, this current took path 24 (FIG. 2) because it could not pass through shorting region 4 of the wrong conductivity type, as explained earlier. Realizing that the illustration is greatly magnified, and that the actual physical distance between emitter-base junction 6 and base-collector junction 5 is on the order of a few microns, the path 24 for base current flow entirely through the base region is in fact very small. This extremely small path is a difficult course for current flow. The difficulty the current encounters is expressed in a factor called base spreading resistance which is substantially increased by the presence of the shorting region 4.

On the contrary, referring to FIG. 1, the improved devices of the invention having an alignment of spaced-apart shorting regions, provide a direct path 25 for current flow from emitter to base electrodes. The base spreading resistance of the devices is therefore substantially reduced. The devices therefore not only provide complete cutoff of collector current in one mode of operation, but also a substantially lower base spreading resistance in the other.

Figure 3:
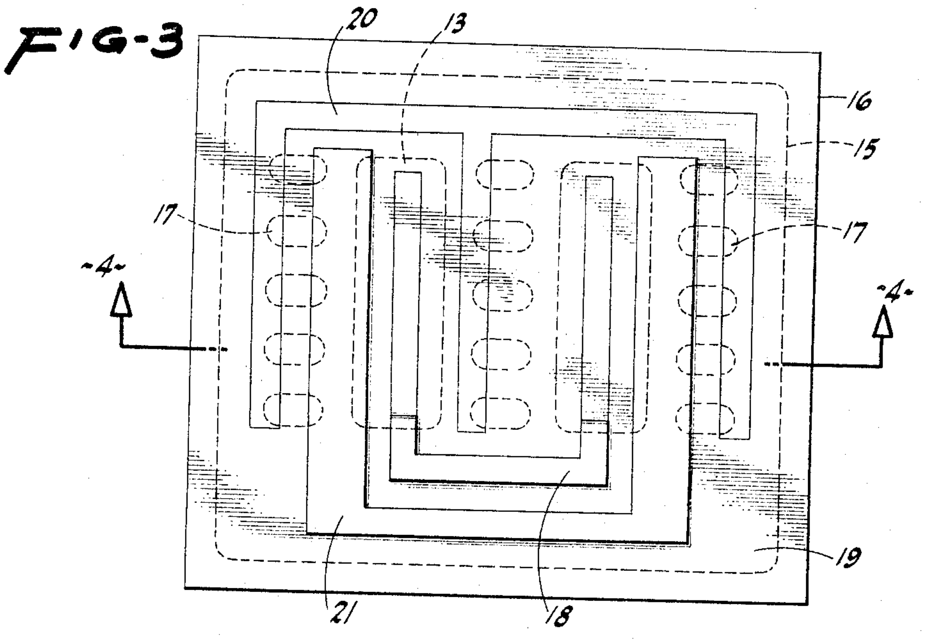
FIG. 3 is a somewhat schematic, greatly enlarged plan view of another embodiment of the invention.
Figure 4:
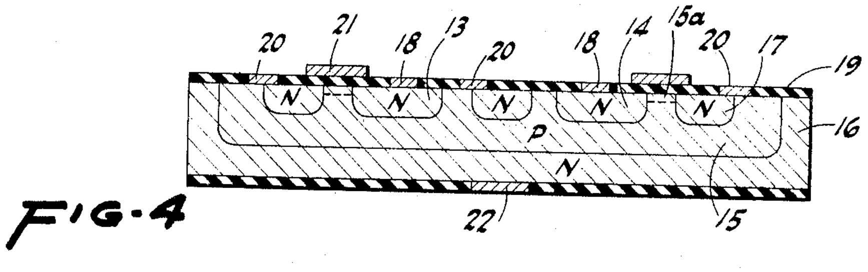
FIG. 4 is a somewhat schematic, greatly enlarged transverse section taken along the line 4—4 of FIG. 3.

Referring now to FIGS. 3 and 4, the device shown has a pair of emitters 13 and 14, a base 15, a channel region **15*a*, and a collector 16. The shorting regions 17 are aligned in rows, as shown. Again, according to the invention, these regions are spaced apart to provide a direct path between them for majority carriers in the base. The emitter electrode 18 is attached to the emitters 13 and 14. This electrode is separated from the rest of the semiconductor surface by oxide layer 19. Similarly, electrode 20 is connected to each of the shorting regions 17 and also contacts the base region 15, making the preferred ohmic connection between them. If desired, electrode 20 may be a plurality of such electrodes, each connected to one or a group of shorting regions 17. For example, there could be three separate electrodes, each connected to all the shorting regions in one row. Electrode 20, as shown is a single electrode interdigitated with emitter electrode 18. Over the oxide layer 19 and between the edges of emitters 13 and 14 and shorting regions 17, respectively, is the control electrode 21. This electrode is in capacitatively coupled relationship to the surface channel region 15*a*. Electrode 22** is in ohmic contact with the collector region. This device functions in the same manner as the circular device of FIGS. 1 and 2.

Figure 5:
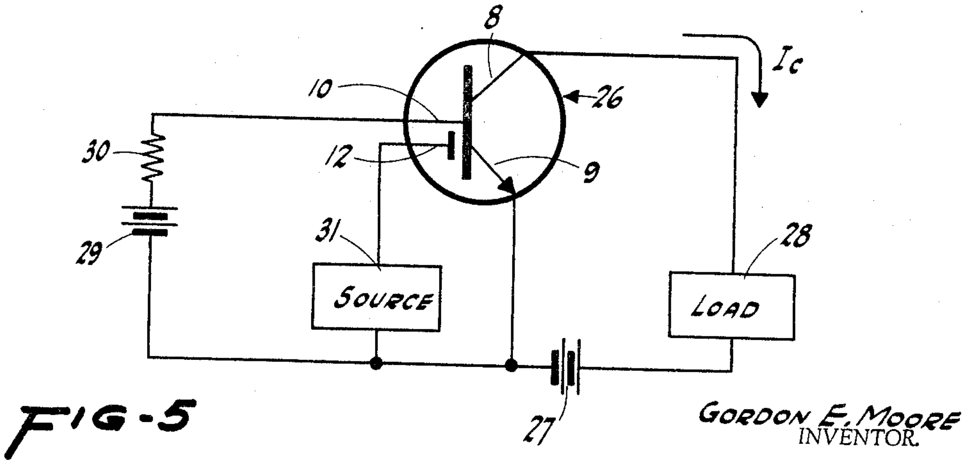
FIG. 5 is a schematic circuit diagram of one possible circuit using the semiconductor tetrode illustrated in FIGS. 1 and 2.

A typical circuit using the semiconductor tetrodes of this invention is illustrated in FIG. 5. Referring to that illustration, the device 26 illustrated in FIGS. 1 and 2 is represented by its recommended symbol. Base electrode 10, collector electrode 8 and emitter electrode 9 are conveniently represented as the standard transistor symbol. The arrowhead pointing away on the emitter electrode signifies that the device is of the NPN type. Control electrode 12 is shown in a manner suggestive of its capacitatively coupled relation to the edge of the emitter-base junction. In the particular circuit illustrated in FIG. 5, the device 26 is connected in a grounded-emitter circuit. The emitter-collector operating voltage is provided by the battery or other voltage supply 27 connected in series with the load 28 between the emitter and collector electrode. A constant bias current is supplied to the base, e.g., by means of a battery 29 and resistor 30, connected in series between the emitter and base electrodes as shown. The input signal (voltage) source 31 is connected between the control electrode 12 and the emitter electrode 9.

The operation of the circuit is as follows. Voltage source 31 supplies the signal to the control electrode 12. When this signal is adjusted to at least its proper cutoff value, collector current through collector 8 is substantially completely cut off, providing no current $I_c$ to the load. At that time, base 10 is effectively shorted to emitter 9 to provide a circuit for current flow across resistor 30.

However, at all other times when source 31 is not at least at cutoff voltage, current $I_c$ is flowing from voltage source 27 through emitter 9, base 10, collector 8 and load 28. The improved devices of this invention substantially reduce the resistance of the tetrode in this circuit.

Many other circuit configurations will be apparent to one skilled in the art. For example, referring to FIG. 5, the bias voltage 29 and resistor 30 could be interchanged with source 31, still retaining their grounded-emitter circuit configuration. The operation of such a circuit is substantially identical to the operation of a conventional transistor connected as a grounded-emitter amplifier. The semiconductor tetrodes of this invention, of course, may also be used in other well-known circuit configurations, such as grounded-base circuits, grounded-collector circuits, and so forth. Since the semiconductor tetrodes have circuit properties similar to a vacuum tube tetrode, they are extremely useful for circuits in variable-gain amplifiers, mixers, AGC circuits, voltage regulators, and the like.

The principles of this invention are not limited to the specific semiconductor tetrodes disclosed herein. They are readily applicable to other surface-potential controlled semiconductor devices containing adjacent regions of different conductivity types with junctions between them. For example, they are applicable to PNPN devices used for electronic switching and the like. PNPN devices embodying the principles of this invention are highly desirable because of their ability to cut off completely current to certain electrodes of the device in one mode of operation and yet have a relatively small base spreading resistance in another.

It will be appreciated that the specific embodiments illustrated and described are but a few examples of a large number of devices made possible by the inventive principles herein disclosed, all of which are within the scope of the invention as set forth in the following claims.

What is claimed is:

1. A semiconductor device comprising a body of semiconductor having:

a first region of one conductivity type, a second region of the opposite conductivity type disposed within said first region, extending inwardly from one of the surfaces of said first region and forming a first PN junction with said first region having an edge at the surface of said body of semiconductor, a third region forming a second PN junction with the opposite surface of said first region, said second PN junction also having an edge at said surface of said body of semiconductor, an alignment of spaced-apart regions of said opposite conductivity type disposed within said first region extending inwardly from its surface and forming an alignment of PN junctions therewith which have edges at said surface of said body of semiconductor, said edges all lying between said edges of said first and second PN junctions, a surface channel region adjacent to said first region and extending between said first PN junction and said alignment of PN junctions, a control electrode capacitatively coupled to the semiconductor in spaced relationship to said surface channel region and the edges of said first PN junction and said alignment of PN junctions, said electrode adapted to change the conductivity type of said surface channel in response to a change in the potential at said electrode, and means for passing electric current across said first and said second PN junctions.

2. Device of claim 1 having an ohmic connection between at least some of said alignment of regions and said first region.

3. Semiconductor device of claim 1 wherein said semiconductor is silicon and said control electrode is spaced apart from said surface channel by an insulating layer of silicon dioxide.

4. Semiconductor device of claim 1 wherein said surface channel region is of said opposite conductivity type when there is no potential on said control electrode.

5. Semiconductor device of claim 1 wherein said surface channel region is of said one conductivity type when there is no potential on said control electrode.

6. A semiconductor device comprising a body of semiconductor having:

an emitter region, a base region and a collector region with two PN junctions therebetween having edges which extend to the surface of the semiconductor, an alignment of spaced-apart shorting regions of the same conductivity type as said emitter region disposed within said base region, said shorting regions extending inwardly from the surface of the semiconductor and forming an alignment of PN junctions with said base region, each of said junctions having an edge at the surface of said body of semiconductor, said edges all lying between said edges of said two PN junctions, a surface channel region adjacent to said base region and extending between said alignment of junctions and the junction between said base region and a region adjacent to it, a control electrode capacitatively coupled to the semiconductor in spaced relationship to said surface channel region and the edges of the junctions between which said surface channel region extends, said electrode adapted to change the conductivity type of said surface channel region in response to a change in the potential at said electrode, and means for passing electric current across said two PN junctions.

7. Semiconductor device of claim 6 with an ohmic connection between said base region and at least some of said alignment of shorting regions.

8. A semiconductor device comprising a body of semiconductor having:

a base region of one conductivity type, a collector region of the opposite conductvity type adjacent to said base region and forming a first PN junction therewith, said junction having an edge at the surface of said body of semiconductor, an emitter region and two alignments of spaced-apart shorting regions of said opposite conductivity type disposed within said base region and extending inwardly from its surface, said emitter region forming a PN junction with said base region having an edge at the surface of said body of semiconductor, said alignments of shorting regions each forming an alignment of separated PN junctions with said base region, each of said alignments of junctions having edges at the surface of said body of semiconductor, said edges all lying between said edges of the base-emitter and base-collector junctions, two surface channel regions of said body of semiconductor adjacent to said base region, one extending between the base-emitter junction and the alignment of junctions nearer to said base-emitter junction, and the other extending between the base-collector junction and the alignment of junctions nearer said base-collector junction, two control electrodes each capacitatively coupled to the semiconductor in spaced relationship to one of the two said surface channel regions, respectively, and to the junction edges of the junctions between which said surface channel region extends, said electrodes adapted to change the conductivity type of said one of the two surface channel regions in response to a change in the potential at said electrode, and means for passing electric current across said first PN junction.

9. Device of claim 8 having an ohmic connection between said base region and at least some regions of one of said alignments of shorting regions.

10. Apparatus comprising:

a body of semiconductor having a base region of one conductivity type, a collector region of the opposite conductivity type from said base region adjacent to said base region and forming a first PN junction therewith, said junction having an edge at the surface of said body of semiconductor, an emitter region and an alignment of spaced-apart shorting regions, all of said opposite conductivity type disposed within said base region and extending inwardly from its surface, said emitter region forming a second PN junction with said base region having an edge at the surface of said body of semiconductor, and said alignment of shorting regions forming an alignment of PN junctions with said base region, each of said PN junctions having an edge at the surface of said body of semiconductor, said edges all lying between said edges of the base-emitter and base-collector junctions, a surface channel region adjacent to said base region and extending between said alignment of junctions and one of said first and second PN junctions, a control electrode capacitatively coupled to the semiconductor in spaced relationship to said surface channel region and the edges of the junctions between which said surface channel region extends, said electrode adapted to change the conductivity type of said surface channel region in response to a change in the potential of said electrode, a base electrode in electrical contact with said base region, and an emitter electrode in electrical contact with said emitter region; and a voltage supply means connected to said emitter, collector, base, and control electrodes.

11. Apparatus of claim 10 wherein the voltage supply means are connected:

(a) between said collector electrode and one of said emitter and base electrodes;

(b) as means for supplying a fixed-bias current to said base electrode; and (c) as means for supplying an input signal between said control electrode and one of said emitter and base electrodes.

References Cited by the Examiner

UNITED STATES PATENTS

| | | | |
|---|---|---|---|
| 2,900,531 | 8/1959 | Wallmark | 317—235 X |
| 2,981,877 | 4/1961 | Noyce | 317—235 |
| 2,985,804 | 5/1961 | Buie | 317—235 |
| 3,064,167 | 11/1962 | Hoerni | 317—234 |
| 3,097,308 | 7/1963 | Wallmark | 317—234 |
| 3,124,703 | 3/1964 | Sulvan | 317—235 |

JOHN W. HUCKERT, *Primary Examiner.*

J. D. KALLAM, *Assistant Examiner.*